United States Patent [19]
Thomsen

[11] Patent Number: 6,060,955
[45] Date of Patent: May 9, 2000

[54] VOLTAGE COMPENSATED OSCILLATOR AND METHOD THEREFOR

[75] Inventor: Joseph A. Thomsen, Gilbert, Ariz.

[73] Assignee: Microchip Technology Incorporated, Chandler, Ariz.

[21] Appl. No.: 08/954,446

[22] Filed: Oct. 20, 1997

[51] Int. Cl.[7] .................................................. H03B 5/24
[52] U.S. Cl. ........................... 331/111; 331/57; 331/143; 331/173; 331/175
[58] Field of Search ................................... 331/111, 143, 331/173, 175, 57

[56] References Cited

U.S. PATENT DOCUMENTS

| | | | |
|---|---|---|---|
| 3,914,711 | 10/1975 | Carlson et al. | 331/173 X |
| 4,105,950 | 8/1978 | Dingwall | 331/57 |
| 4,122,413 | 10/1978 | Chen | 331/111 X |
| 4,244,043 | 1/1981 | Fujita et al. | 368/85 |
| 4,344,293 | 8/1982 | Fujiwara et al. | 62/126 |
| 5,250,914 | 10/1993 | Kondo | 331/175 X |
| 5,532,653 | 7/1996 | Adkins | 331/143 |

*Primary Examiner*—David Mis
*Attorney, Agent, or Firm*—Harry M. Weiss; Jeffrey D. Moy; Harry M. Weiss & Associates, P.C.

[57] ABSTRACT

A voltage compensated oscillator circuit having a resistor capacitor (RC) circuit for setting a frequency of oscillation for the oscillator circuit. A switching circuit with hysterisis is coupled to the RC circuit for providing upper and lower threshold limits. The upper and lower threshold limits being used for controlling the direction of switching of the oscillator circuit. By adjusting the upper and lower threshold limits, one may compensate for voltage signal fluctuations so that the frequency of oscillation will not change due to power supply voltage fluctuations.

5 Claims, 1 Drawing Sheet

VOLTAGE COMPENSATED OSCILLATOR AND METHOD THEREFOR

BACKGROUND OF THE INVENTION

1. Field of the Invention

This invention relates generally to oscillators, and more specifically, to an accurate resistor-capacitor (RC) oscillator having a frequency which is power supply voltage independent and a method therefor.

2. Background of the Invention

Oscillator circuits are used in a myriad of applications in the electronics industry for providing clock and other timing signals to electronic circuitry such as microprocessors, microcontrollers, flip-flop circuits, latch circuits, charge pumps, etc. A common type of oscillator circuit is the resistor-capacitor (RC) circuit. An RC oscillator circuit typically includes a control circuit which is coupled to the RC network. The control circuit is used for alternatively charging and discharging the capacitor through the resistor to generate an oscillatory signal. The frequency of oscillation is determined by the time constant of the resistor and capacitor.

Even though the frequency of oscillation is primarily dependent on the RC network, the frequency is also affected by the power supply voltage. The control circuitry of the RC oscillator is typically comprised of a plurality of CMOS transistors. A fundamental function of CMOS circuitry is that as power supply voltage is lowered, activity slows down. Thus, in an RC oscillator having CMOS transistors, the frequency of oscillation will tend to slow down as the power supply voltage is lowered.

Therefore, a need existed to provide an improved oscillator circuit and a method therefor. The improved oscillator circuit and a method therefor must be more accurate than prior art RC oscillator circuits. The improved oscillator circuit and method therefor must also be able to generate a frequency of oscillation which is independent of the power supply voltage.

SUMMARY OF THE INVENTION

In accordance with one embodiment of the present invention, it is an object of the present invention to provide an improved oscillator circuit and a method therefor.

It is another object of the present invention to provide an improved RC oscillator circuit and a method therefor.

It is another object of the present invention to provide an improved RC oscillator circuit and a method therefor that is more accurate than prior art RC oscillators.

It is still another object of the present invention to provide an improved RC oscillator circuit and a method thereof or that is able to generate a frequency of oscillation which is independent of the power supply voltage.

BRIEF DESCRIPTION OF THE PREFERRED EMBODIMENTS

In accordance with one embodiment of the present invention, a voltage compensated oscillator circuit is disclosed. The voltage compensated oscillator circuit uses a resistor capacitor (RC) circuit for setting a frequency of oscillation for the voltage compensated oscillator circuit. A switching circuit with hysterisis is coupled to the RC circuit. The switching circuit is used for providing upper and lower threshold limits for controlling the direction of switching for the voltage compensated oscillator circuit. By adjusting both the upper and lower threshold limits one may compensate for voltage signal fluctuations.

In accordance with another embodiment of the present invention, a method of providing a voltage compensated oscillator circuit is disclosed. The method comprises the steps of: providing a resistor capacitor (RC) circuit for setting a frequency of oscillation for the voltage compensated oscillator circuit; providing a switching circuit with hysterisis coupled to the RC circuit for providing upper and lower threshold limits for controlling the direction of switching for the voltage compensated oscillator circuit to compensate for voltage signal fluctuations; providing a buffer circuit coupled to the switching circuit for sending signals to activate and deactivate the voltage compensated oscillator circuit; and providing a logic circuit coupled to the RC circuit and to the switching circuit for sending signals to charge and discharge a capacitor of the RC circuit.

The foregoing and other objects, features, and advantages of the invention will be apparent from the following, more particular, description of the preferred embodiments of the invention, as illustrated in the accompanying drawing.

DETAILED DESCRIPTION OF THE PREFERRED EMBODIMENTS

Figure 1:
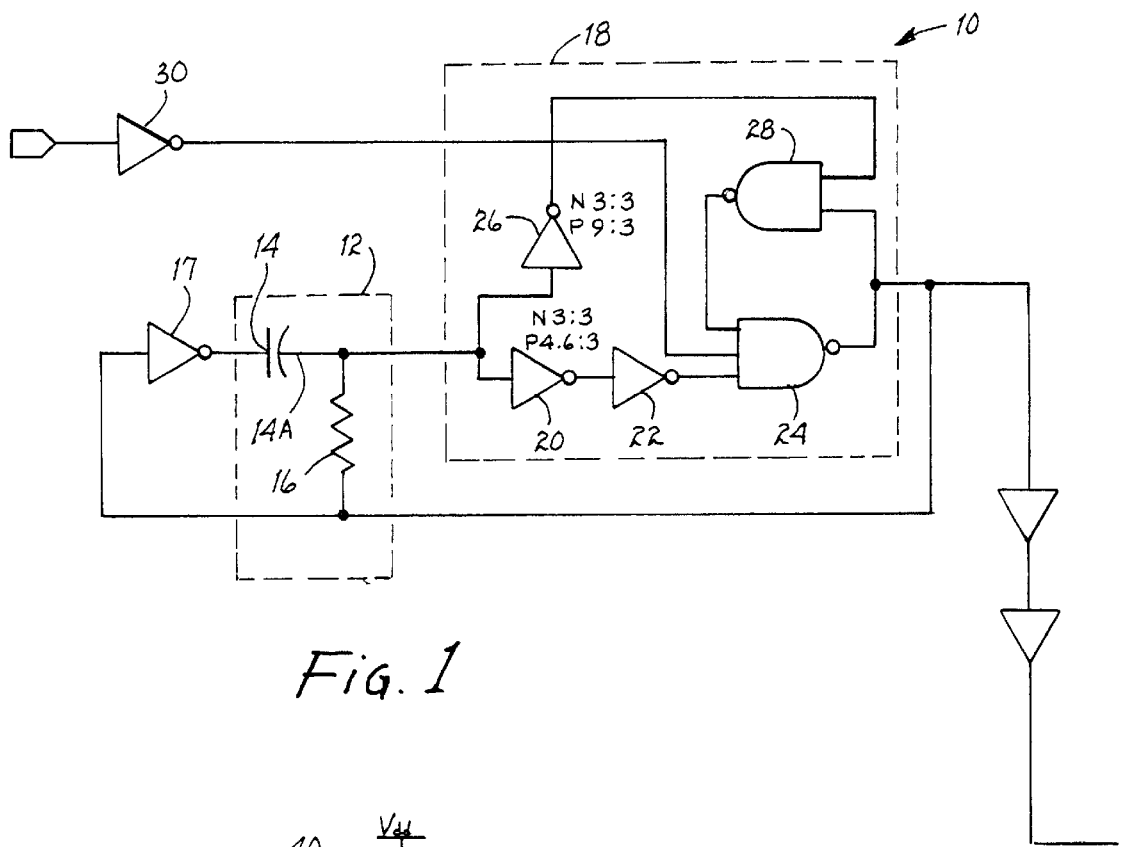
FIG. 1 shows a simplified electrical block diagram of the voltage compensated oscillator circuit of the present invention.

Referring to FIG. 1, a voltage compensated oscillator circuit 10 (hereinafter oscillator 10) is shown. The oscillator 10 is an extreme accurate oscillator which is power supply voltage independent.

One of the components of the oscillator 10 is a resistor-capacitor (RC) circuit 12. In the embodiment depicted in FIG. 1, the RC circuit 12 has a capacitor 14 which has a terminal 14A directly coupled to a resistor 16. The RC circuit 12 is used for setting the frequency of oscillation for the oscillator 10. By adjusting the RC time constant of the RC circuit 12, one may adjust the frequency of oscillation for the oscillator 10. The RC time constant is the time it takes to charge and discharge the capacitor 14 through the resistor 16 to set voltage levels.

In the present embodiment, a logic circuit 17 is coupled to the RC circuit 12. The logic circuit is used to send a signal to charge and discharge the capacitor 14 of the RC circuit 12. The logic circuit 17 is an inverter in the embodiment depicted in FIG. 1.

As stated above, the frequency of oscillation is primarily dependent on the RC time constant of the RC circuit 12. However, the frequency is also affected by the power supply voltage. In prior art oscillators, the frequency of oscillation tended to slow down as the power supply voltage was lowered. To solve this prior art problem, a switching circuit 18 with hysterisis is coupled to the RC circuit 12. The switching circuit 18 will have two different switching threshold points (i.e., a positive going threshold point $V_p$, and a negative going threshold point $V_p$). The two switching threshold points will be at different voltages relative to one another unlike true CMOS devices which switch at the same level. A low voltage signal will not change the state of the switching circuit 18 until it passes the positive going threshold point $V_t$. A high voltage signal that passes into the hysterisis zone will remain high until it reaches the negative going threshold point $V_t$.

By adjusting the two different switching threshold points one may compensate for voltage signal fluctuations. For example, if the switching threshold points are adjusted so that at higher voltages the switch threshold points are farther away and at lower voltages the switching threshold points are closer together, the switching circuit 18 will switch faster at lower voltages. Thus, by properly adjusting the switching threshold points, the frequency of oscillation of the oscillator 10 will not slow down as the power supply voltage is lowered (i.e., power supply voltage independent). Furthermore, if desired, the switching threshold points may be adjusted such that the switching circuit 18 speeds up at lower voltages. This would be ideal for generating a clock signal for a charge pump. Charge pumps are less efficient at lower voltages. Thus, for a charge pump, it is desirable to have an oscillator signal whose frequency is inversely proportional to the power supply voltage. In the preferred embodiment of the present invention, the switching circuit 18 is a Schmidt Trigger.

The switching circuit 18 is comprised of two separate paths having the same number of inversions. One of the paths sets the high level switch point and the second path sets the low level switch point. In the embodiment depicted in FIG. 1, the low level path has a first inverter 20 having an input coupled to the RC circuit 12. The output of the first inverter 20 is coupled to an input of a second inverter 22. The output of the second inverter 22 is coupled to a logic gate 24. The logic gate being a NAND gate in the present embodiment. The high level path also has an inventer 26 coupled to the RC circuit 12. The output of the inverter 26 is coupled to an input of a NAND gate 28. A second input of the NAND gate 28 is coupled to an output of the logic gate 24. The output of the NAND gate 28 is coupled to an input of the NAND gate 24. A third input of the NAND gate 24 is coupled to an input signal for activating and deactivating the oscillator 10. The input signal being run through a buffer circuit 30. The buffer circuit 30 being an inverter in the present embodiment.

In operation, the logic gate 24 controls the selection of the path through the switching circuit 18 (i.e., what path is enabled). When the output of the logic gate 24 goes low, it will force off the NAND gate 28. Thus, the high level path will have no effect. The opposite effect is also true. When the output of the logic gate 24 goes high, the signal is fed back to the switching circuit and turns off the low level path.

Figure 2:
FIG. 2 shows a simplified electrical schematic of the inverters used in the voltage compensated oscillator circuit depicted in FIG. 1.

Referring to FIG. 2, both inverters 20 and 26 are comprised of a p-channel transistor 40 coupled to an n-channel transistor 42. The p-channel transistor has drain, gate and source terminals. The source terminal of the p-channel transistor 40 is coupled to a voltage bias source $V_{dd}$. The gate of the p-channel transistor 40 is coupled to the RC circuit 12 (FIG. 1). The n-channel transistor 42 also has drain, gate, and source terminals. The drain terminal of the n-channel transistor 42 is coupled to the drain terminal of the p-channel transistor 40. The gate terminal of the n-channel transistor is coupled to the gate terminal of the p-channel transistor 40 and to the RC circuit 12. The source terminal of the n-channel transistor 42 is coupled to ground. The size ratio (l/w) of the p-channel transistor to the n-channel transistor is used to set the high level and low level switch point. The inverter 26 of the high level path should have a higher size ratio for the p-channel 40 over the n-channel transistor 42 than for the inverter 20 of the low level path. In the embodiment depicted in FIG. 1, the inverter 26 of the high level path will have a ratio of approximately 3 while the inverter 20 will have a lower ratio of approximately 1.5. By adjusting the size ratios of the of the p-channel transistor 40 to the n-channel transistor 42 of both inverters 20 and 26 one can control the switching points of the switching circuit 18 and thus make the oscillator 10 power supply voltage independent.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A voltage compensated oscillator circuit comprising:

a switching circuit with hysteresis for providing upper and lower threshold points to control switching of said voltage compensated oscillator circuit to compensate for power supply voltage variation;

a feedback loop coupled to said switching circuit comprising:
   an inverter wherein an input of said inverter is directly connected to an output of said switching circuit; and
   a capacitor wherein an electrode of said capacitor is directly connected to an output of said inverter and a second electrode of said capacitor is directly connected to an input of said switching circuit; and a resistor wherein a terminal of said resistor is directly connected to said second electrode of said capacitor and a second terminal of said resistor is directly connected to said output of said switching circuit.

2. The circuit in accordance with claim 1 further comprising a buffer circuit directly connected to said switching circuit for activating and deactivating said voltage compensated oscillator circuit.

3. The circuit in accordance with claim 1 wherein said switching circuit is a Schmidt trigger.

4. The circuit in accordance with claim 1 further comprising a power supply coupled to the voltage compensated oscillator circuit wherein the upper and lower threshold points may be adjusted such that an output frequency of the voltage compensated oscillator will remain nearly constant as a voltage provided by the power supply voltage is decreased.

5. The circuit in accordance with claim 1 further comprising a power supply coupled to the voltage compensated oscillator circuit wherein the upper and lower threshold points may be adjusted such that an output frequency of the voltage compensated oscillator will remain nearly constant as a voltage provided by the power supply is increased.

* * * * *